(12) United States Patent
Hua et al.

(10) Patent No.: US 8,003,532 B2
(45) Date of Patent: Aug. 23, 2011

(54) METHOD OF USING AN ELECTROLESS PLATING FOR DEPOSITING A METAL SEED LAYER FOR THE SUBSEQUENT PLATED BACKSIDE METAL FILM

(75) Inventors: Chang-Hwang Hua, Tao Yuan Shien (TW); Wen Chu, Tao Yuan Shien (TW)

(73) Assignee: Win Semiconductors Corp., Tao Yuan Shien (TW)

( * ) Notice: Subject to any disclaimer, the term of this patent is extended or adjusted under 35 U.S.C. 154(b) by 63 days.

(21) Appl. No.: 12/656,073

(22) Filed: Jan. 15, 2010

(65) Prior Publication Data

US 2011/0059610 A1    Mar. 10, 2011

(30) Foreign Application Priority Data

Sep. 4, 2009  (TW) .............................. 98129957 A

(51) Int. Cl.
*H01L 21/78* (2006.01)
*H01L 21/46* (2006.01)
*H01L 21/301* (2006.01)
*H01L 21/44* (2006.01)

(52) U.S. Cl. ........ 438/667; 438/465; 438/668; 438/639; 438/672; 257/E21.585; 257/E21.597

(58) Field of Classification Search ........... 257/E21.585, 257/E21.597
See application file for complete search history.

(56) References Cited

U.S. PATENT DOCUMENTS

| 7,226,812 B2 * | 6/2007 | Lu et al. ................. 438/114 |
| 7,253,492 B2 * | 8/2007 | Ma et al. ................. 257/502 |
| 2009/0032871 A1 * | 2/2009 | Vervoort et al. ............. 257/341 |

* cited by examiner

*Primary Examiner* — Mohsen Ahmadi
(74) *Attorney, Agent, or Firm* — Bacon & Thomas, PLLC

(57) ABSTRACT

A method of backside metal process for semiconductor electronic devices, particularly of using an electroless plating for depositing a metal seed layer for the plated backside metal film. The backside of a semiconductor wafer, with electronic devices already fabricated on the front side, is first coated with a thin metal seed layer by electroless plating. Then, the backside metal layer, such as a gold layer or a copper layer, is coated on the metal seed layer. The metal seed layer not only increases the adhesion between the front side metal layer and the backside metal layer through backside via holes, but also prevents metal peeling after subsequent fabrication processes. This is helpful for increasing the reliability of device performances. Suitable materials for the metal seed layer includes Pd, Au, Ni, Ag, Co, Cr, Cu, Pt, or their alloys, such as NiP, NiB, AuSn, Pt—Rh and the likes.

6 Claims, 8 Drawing Sheets

METHOD OF USING AN ELECTROLESS PLATING FOR DEPOSITING A METAL SEED LAYER FOR THE SUBSEQUENT PLATED BACKSIDE METAL FILM

1. FIELD OF THE INVENTION

The present invention discloses a method of backside metal process for semiconductor electronic devices, particularly of using an electroless plating process for coating a metal seed layer for the subsequent backside plated metal, which not only improves the adhesion between the surface metal and the backside metal layers through backside via holes, but also prevents metal peeling during the subsequent fabrication processes.

2. BACKGROUND OF THE INVENTION

Heterojunction Bipolar Transistors (HBTs) as well as High-Electron Mobility Transistors and (HEMTs) are important semiconductor electronic devices for a variety of applications, such as microwave, millimeter wave, and optoelectronic applications. For advanced multifunction devices, which include more than one device type on a common substrate, it is important to consider not only the die size and cost reduction, but also the performance of the integrated circuits with additional functionality. To achieve this goal, much effort has been made on the development of reliable fabrication processes of monolithic integrated devices for volume productions.

Backside metal process is one of the key process steps for the fabrication of integrated semiconductor devices. Regardless of device types and functionalities, it is necessary to provide grounding for those transistors fabricated on the front surface of a semiconductor wafer. Therefore, ground pads were usually disposed either in the vicinity of, or at a distance from, those front-side devices, depending on the surface device layout. In general, for a space saving purpose, a common ground pad is usually shared by many transistors. FIG. 1 is a cross-sectional view of a substrate formed by a semiconductor wafer 100 with ground pads formed thereon. The ground pad consists of a surface metal layer 101, a backside via hole 102 and a backside metal layer 103, which contacts electrically to the surface metal layer 101 through the backside via hole 102. Conventionally, electronic devices, such as HBTs and HEMTs, are first fabricated on the front surface. A surface metal layer is then deposited to define ground pad areas. The substrate is usually mechanically thinned to a certain thickness, in order to facilitate subsequent fabrication processes for backside via holes 102. The positions, sizes and shapes of backside via holes 102 are then defined on the wafer backside using the conventional lithography technique, which followed by either dry or wet chemical etchings to create via holes through the wafer to the surface metal layer 101. Finally, a backside metal layer 103 is deposited on the wafer backside, by which a good electrical contact to the surface metal layer 101 via the backside via holes 102 can be achieved. It is worth to mentioned that since the surface metal layer 101 of the ground pad is contacted not only electrically but also thermally to the whole backside metal layer 103 through the via hole 102, the ground pad can also acts as a heat sink for the front side devices.

Conventionally, the backside metal processes for GaAs based integrated devices usually utilize sputter to coat a metal seed layer on the rear surface and the backside via holes. However, by using the conventional method, it is difficult to form a thin metal seed layer with good uniformity and free of defect, and thereby hard to provide good adhesion for backside metals (such as Au, Al or Cu, etc.) on the rear surface, and particularly on the inner sidewalls of via holes. This situation will become even worse for via holes with very large aspect ratio. As a consequence, the backside metal layer becomes easily peeled off the surface metal layer during the subsequent fabrication processes, leading to poor device grounding and hence degradations in device performance, reliability and overall yield.

The material of the backside metal itself is also an important consideration. For GaAs-based integrated devices, the most commonly used backside metal is gold. Recently, semiconductor manufacturers have begun using copper as backside metal, because of its lower resistivity and manufacture costs. However, a drawback of using copper as a backside metal is that Cu atoms can easily diffuse into the GaAs substrate, which may even reach the active area of front-side devices, leading to device damages.

Therefore, it is necessary to develop a method of backside metal process for semiconductor electronic devices, which not only improves the adhesion between the front side metal layer and the backside metal layer through backside via holes, but also prevents metallic atoms of the backside metal diffusing into the active area of front surface devices.

SUMMARY OF THE INVENTION

It is an object of the present invention to provide a fabrication method of backside metal processes for fabricating integrated semiconductor devices, by which a good electrical contact between the backside metal layer and the front side metal layer can be achieved, the metal peeling during subsequent fabrication processes can be prevented, and the diffusion of metallic atoms from the backside metal into the active area of front side devices can be suppressed.

In order to achieve the previously mentioned objective, the present invention provide a method of backside metal processes using electroless plating to form a metal seed layer for the subsequent backside metal layer. The metal seed layer coated using the electroless plating method can achieve good thickness uniformity and free of defect, and thereby not only providing good adhesion for backside metals on either the rear surface or the inner sidewalls of via holes even with a very large aspect ratio, but also mitigating the diffusion of metallic atoms from the backside metal into the active area of front side devices.

The backside metal processes of the present invention, which can be applied to semiconductor wafers with devices fabricated thereon and after wafer thinning processes, comprise steps of:

Defining the sizes, shapes and positions of backside via holes on the wafer backside using conventional photolithography processes;

Fabricating the backside via holes using either dry or wet chemical etchings;

coating a thin metal layer or a thin metallic alloy layer as a backside metal seed layer on the wafer's rear surface and on the inner sidewalls of backside via holes using the electroless plating method; and depositing a backside metal layer in the final to make good electrical contact to the surface metal layer via the backside via holes.

The advantages of coating the backside metal seed layer using the electroless plating method are threefold, including
1. Cost reduction;
2. Volume production;
3. High uniformity in the thickness;

4. Good adhesion to substrate;
5. Improve the performance of front side devices.

Suitable materials for the metal seed includes Pd, Au, Ni, Ag, Co, Cr, Cu, Pt, or their alloys, such as NiP, NiB, AuSn, Pt—Rh and the likes.

The following detailed description, given by way of examples or embodiments, will best be understood in conjunction with the accompanying drawings.

DETAILED DESCRIPTION OF THE INVENTION

Figure 1:
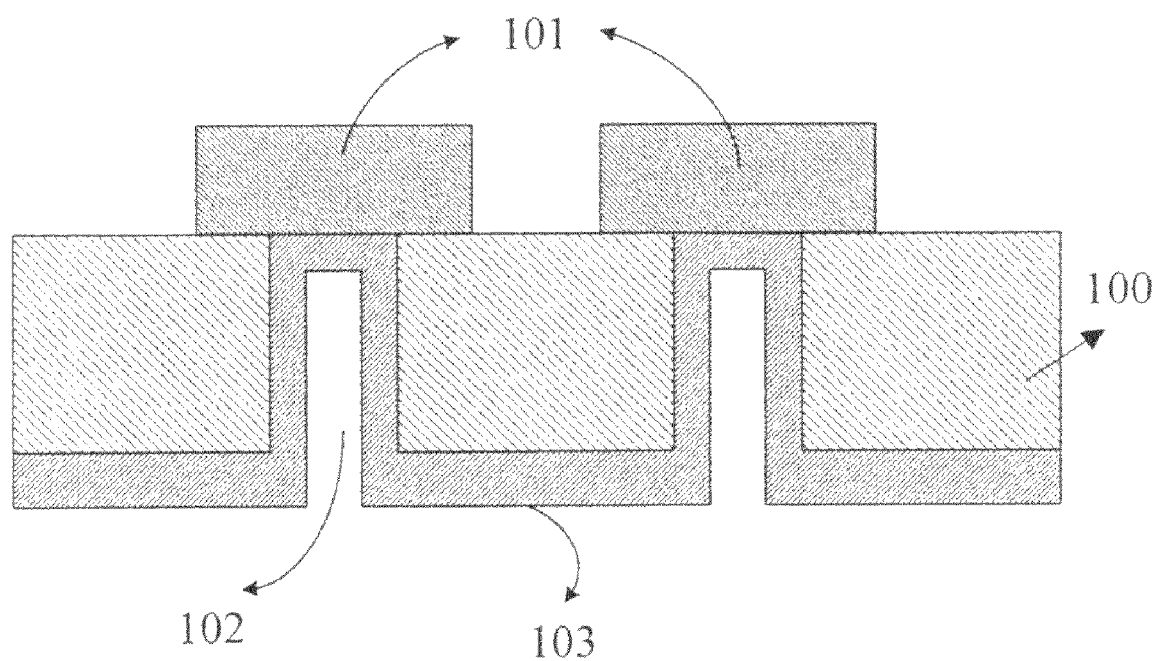
FIG. 1 is a schematic of the cross-sectional view of a substrate formed by a semiconductor wafer with ground pads formed thereon. It clearly illustrates how the front side metal layer of the ground pad can make a good electrical contact to the backside metal layer through backside via holes.
Figure 2A:
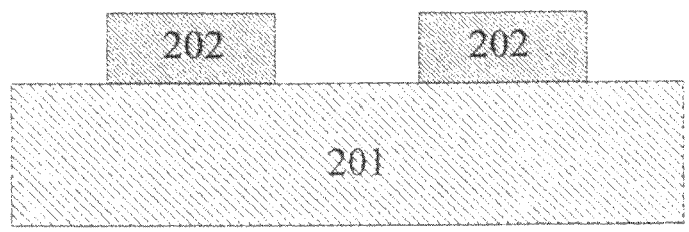
FIGS. 2(a) to 2(d) are schematics illustrating the process flow of the method of backside metal processes using electroless plating of the present invention.
Figure 2B:
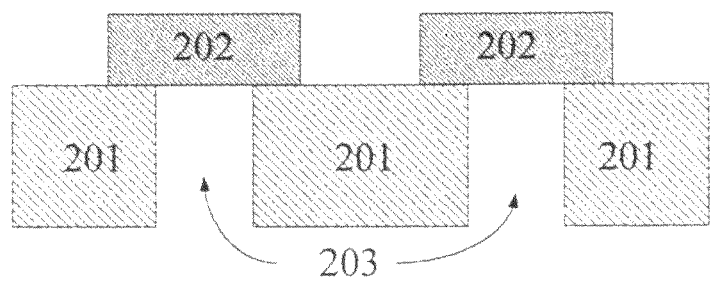
Figure 2C:
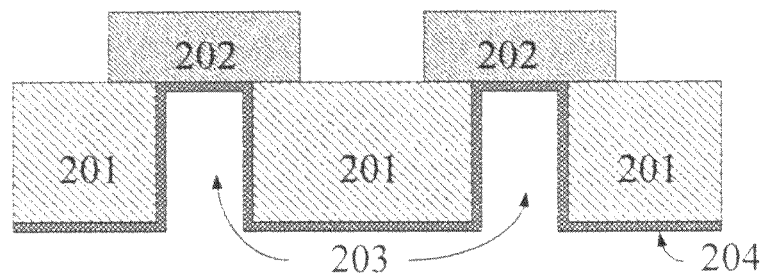
Figure 2D:
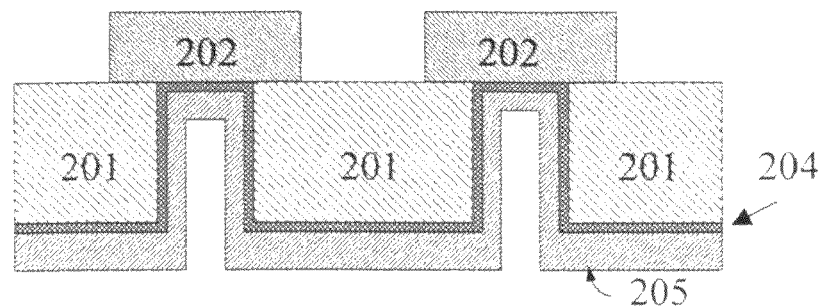
Figure 3B:
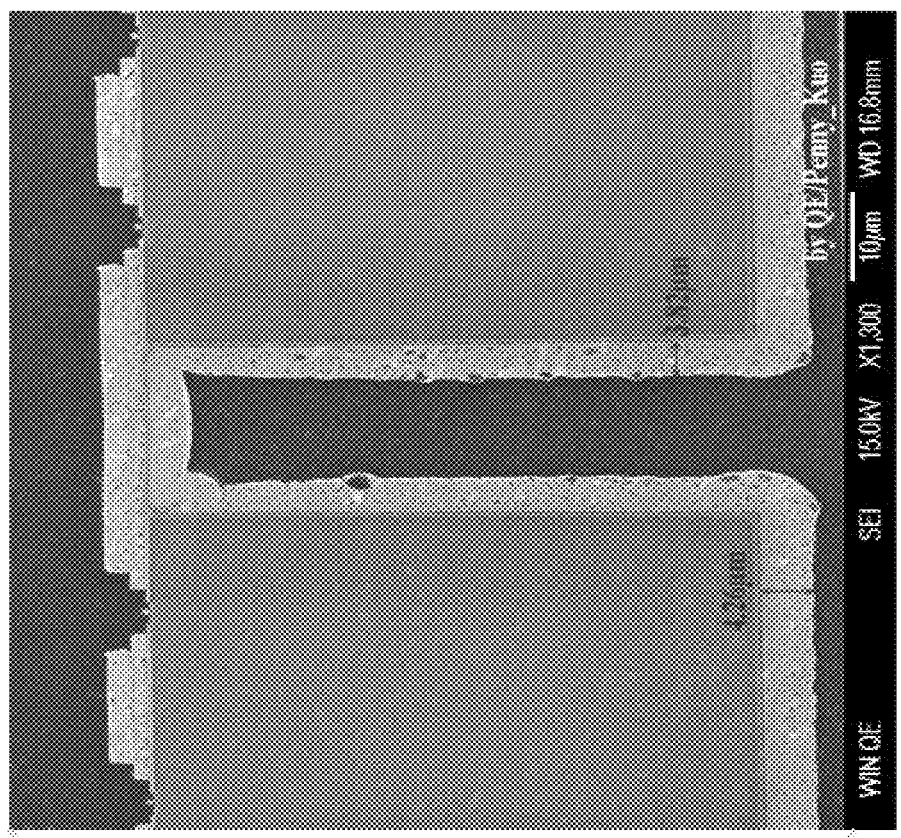
FIGS. 3(a) to 3(d) are cross sectional SEM images of a real semiconductor wafer near the backside via holes.
Figure 3A:
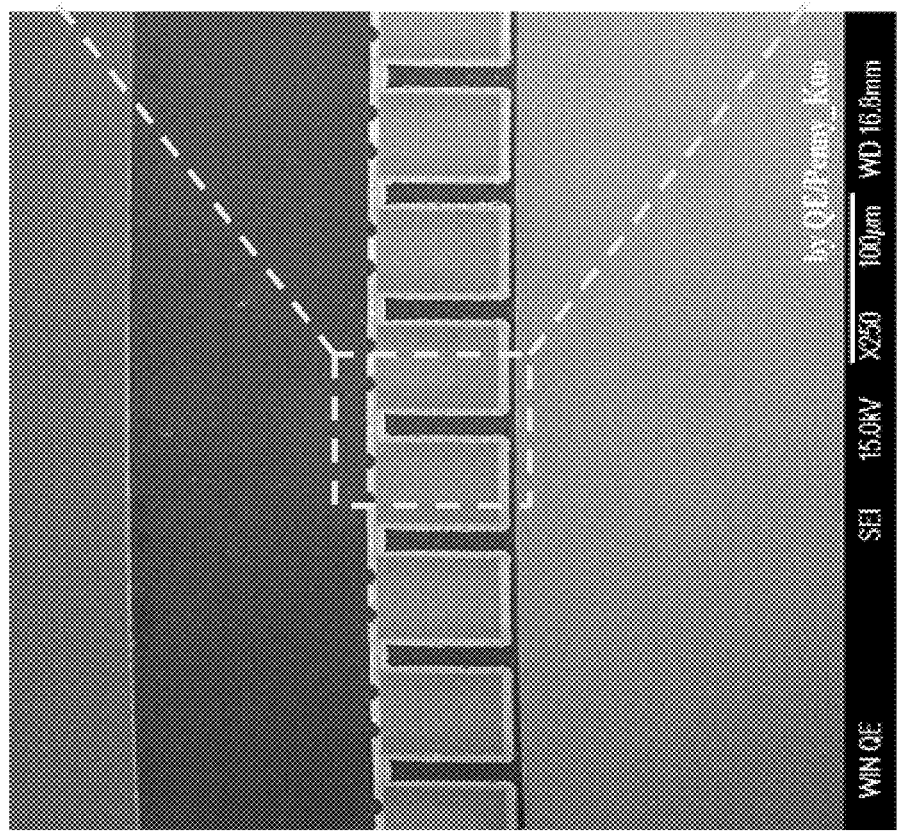
Figure 3D:
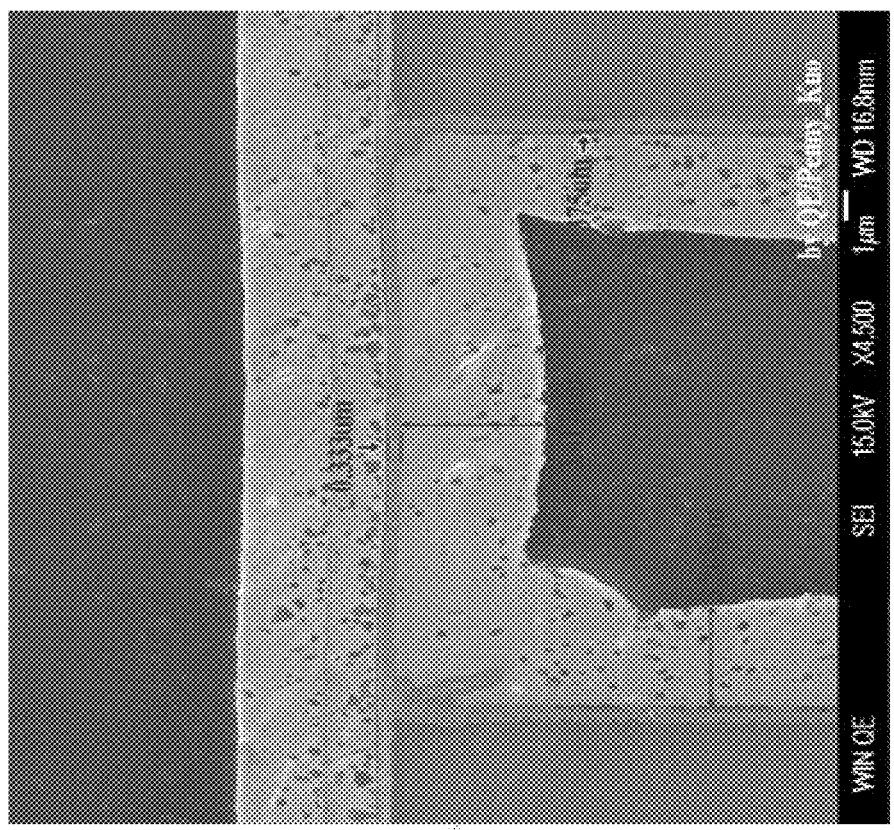
Figure 3C:
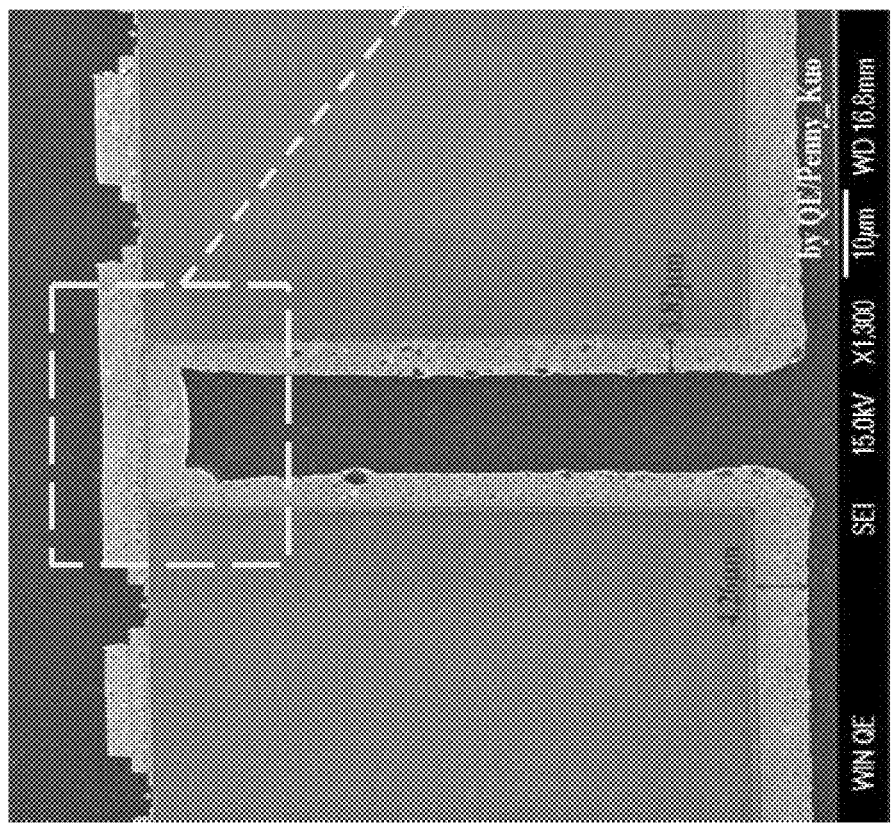

FIGS. 2(a) to 2(d) are schematics illustrating the process flow of the present invention for the method of backside metal processes using electroless plating. As shown in FIG. 2(a), the process start from a semiconductor wafer 201 with a surface metal layer 202 fabricated thereon. The semiconductor wafer 201 can be thinned mechanically to a certain thickness, in order to facilitate subsequent fabrication processes for backside via holes. FIG. 2(b) illustrates the first step of the present invention. In the first step, the sizes, shapes and positions of backside via holes are first defined on the backside of the semiconductor wafer 201 using the conventional lithography technique. Etching processes are then performed to etch via holes through the semiconductor wafer to the surface metal layer 202. The etching process can be done either by dry etching process using the reactive ion etching technique, or by wet etching process using suitable chemical solutions as etchants. FIG. 2(c) is the second step of the present invention. In this step, a thin metal layer or a metallic alloy layer, which will be acting as a seed layer 204 for subsequent backside metal layer, is coated on the backside of the semiconductor wafer 201 using the electroless plating technique. This technique is a commonly used method for coating a thin metal film on another host material, and is particular useful on those materials with poor electrical conductivity. The electroless plating is performed by immersing the semiconductor wafer in a plating solution containing sources of metal, following by the reaction of an additive agent, which will make metallic ions in the solution metalized on the wafer and forming a thin film. For electroless palladium plating as an example, the plating solution is usually an aqueous solution of palladium salt, such as palladium chloride, palladium bromide, palladium nitrate, palladium sulfate, palladium oxide or palladium hydroxide. After the reaction with suitable additive agents, such as formaldehyde, formic acid, or hypophosphorous acid, metallic palladium will be adhered onto the backside of the semiconductor wafer. By controlling the concentration, temperature and pH value of the plating solution as well as plating time, the thickness of palladium film can be precisely controlled. According to the experimental results of the present invention, the preferred thickness of the metal seed layer is in the range of 20-500 nm. FIG. 2(d) is the final step of the present invention, in which the backside metal layer 205 is deposited on the seed layer 204. In this step, the backside metal can be gold or copper or the like, depending on processing needs.

Figure 4:
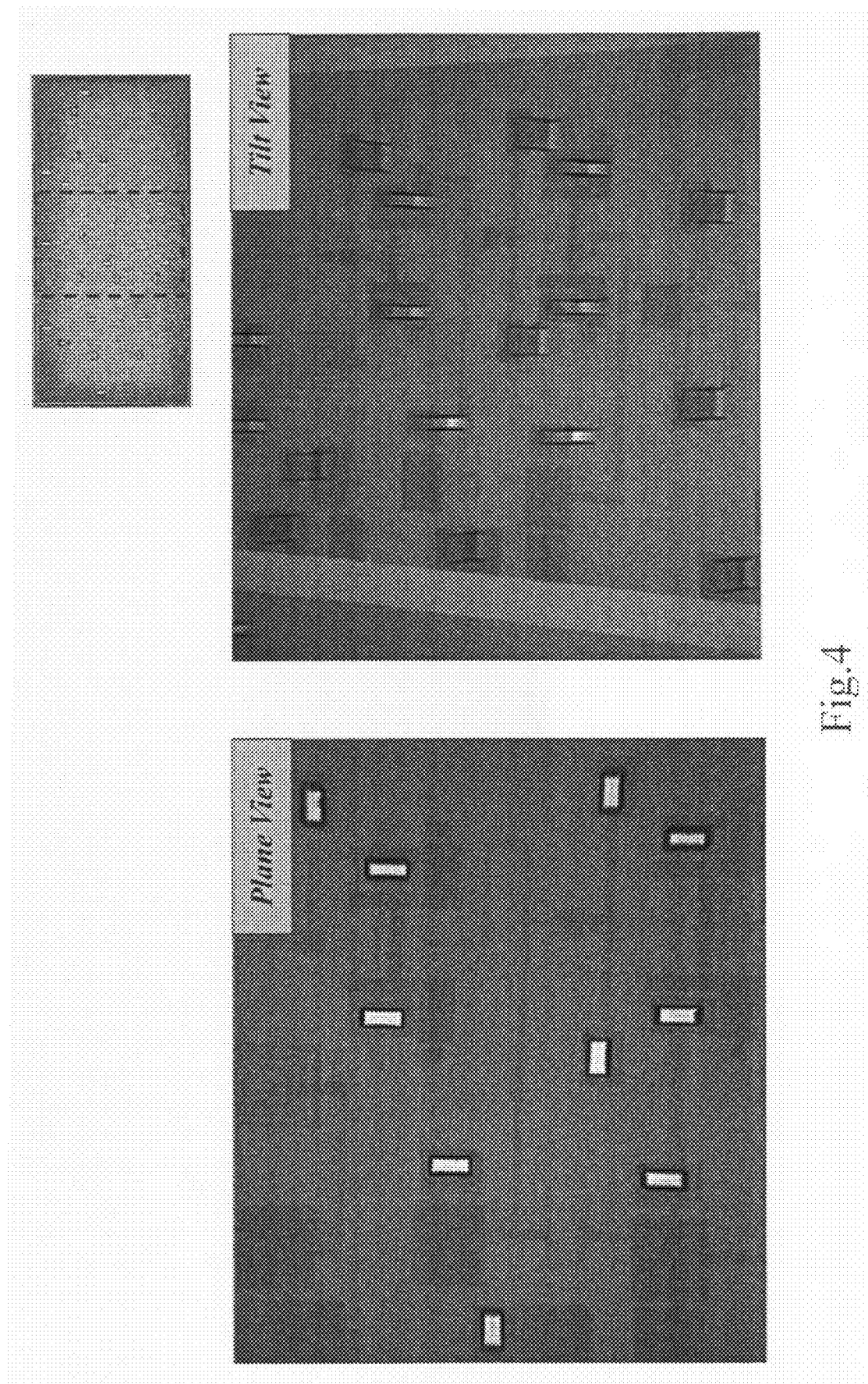
FIG. 4 is a three-dimensional X-ray image near the backside via holes of a real semiconductor wafer with devices fabricated thereon.

The method of backside metal processes of the present invention has been proven experimentally that the metal peeling effect can be effectively prevented, making good electrical contact between the surface metal and the backside metal layers. FIGS. 3(a) to 3(d) and FIG. 4 are experimental results using electroless palladium plating layer as a seed layer for backside metal. In FIGS. 3(a) to 3(d), a number of cross sectional SEM images of a real semiconductor wafer near a backside via hole are displayed. It is worth to mention that the wafer shown in FIG. 3 have been treated by hot baking at 350° C. for 30 minutes. However, no apparent metal peeling can be found. FIG. 4 are three-dimensional X-ray images near the backside via holes of a real semiconductor wafer with devices fabricated thereon. Again, no apparent metal peeling can be found in the wafer with electrolessly plated seed layer for backside metal, even after high temperature treatment of hot baking at 350° C. for 30 minutes.

Figure 5:
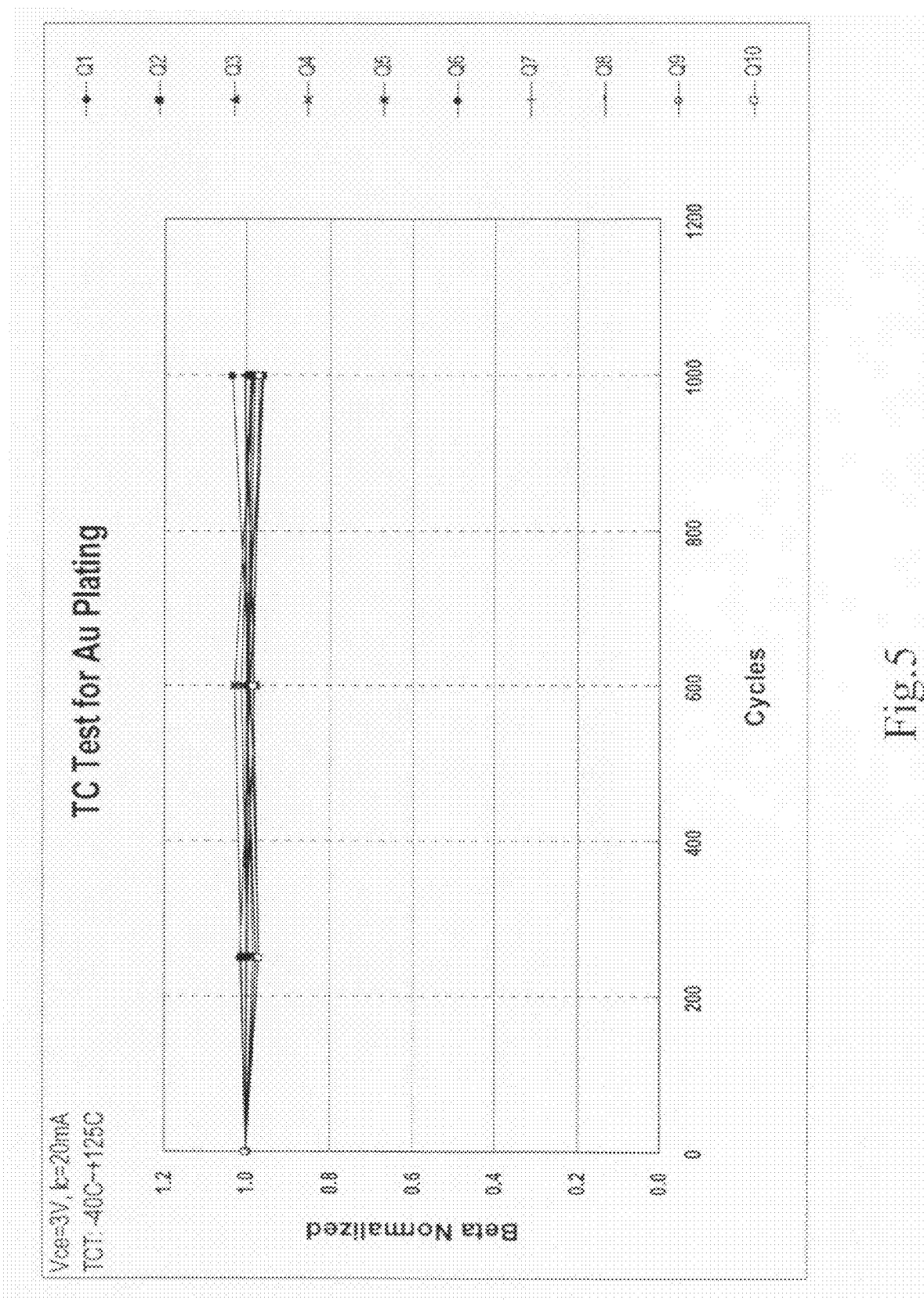
FIG. 5 is the thermal-cycle (TC) testing result of beta values for those transistors fabricated on wafers with backside metal layer (Au) coated by the method of the present invention.
Figure 6:
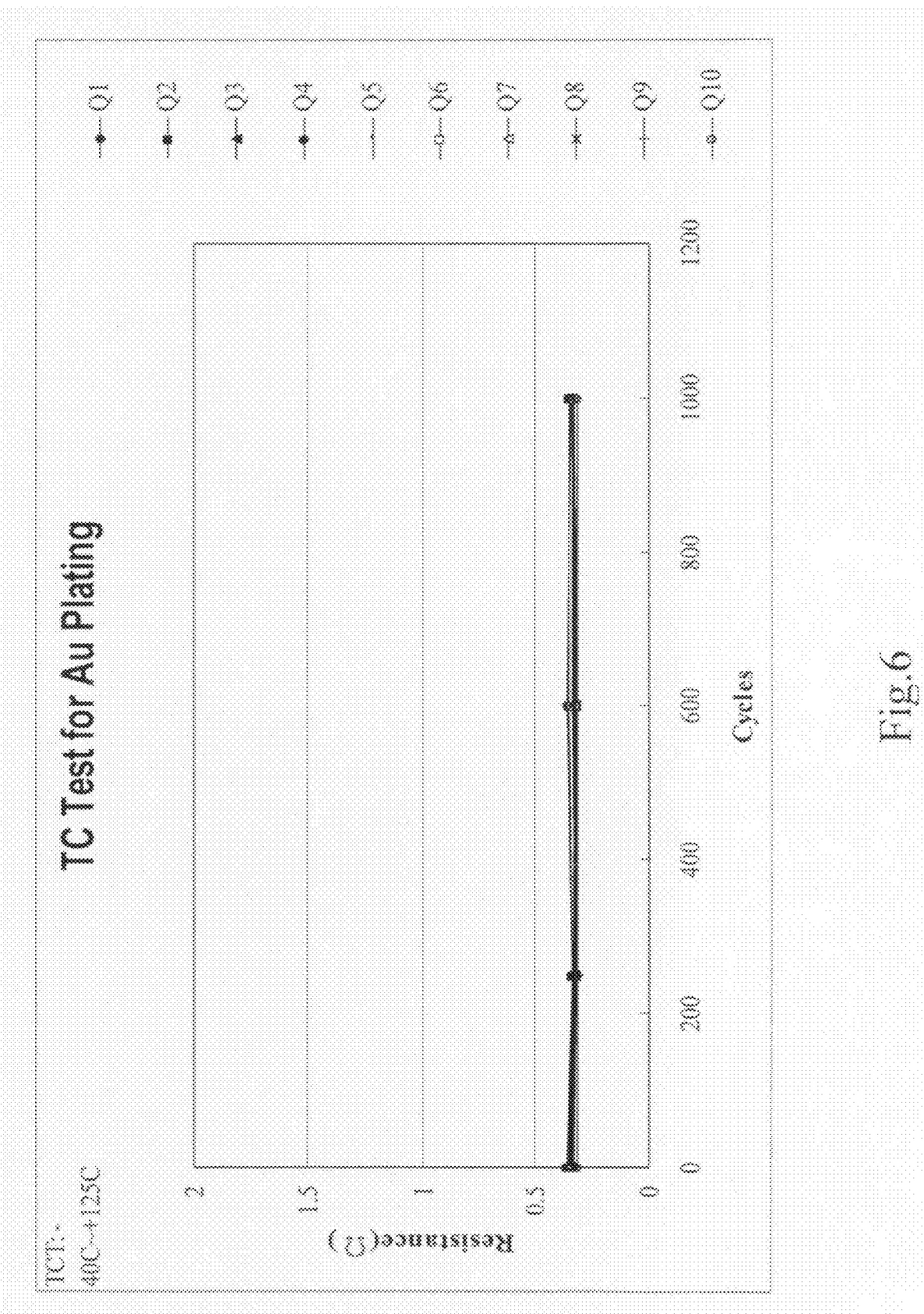
FIG. 6 is the thermal-cycle (TC) testing result of resistance for those transistors on fabricated wafers with backside metal layer (Au) coated by the method of the present invention.
Figure 7:
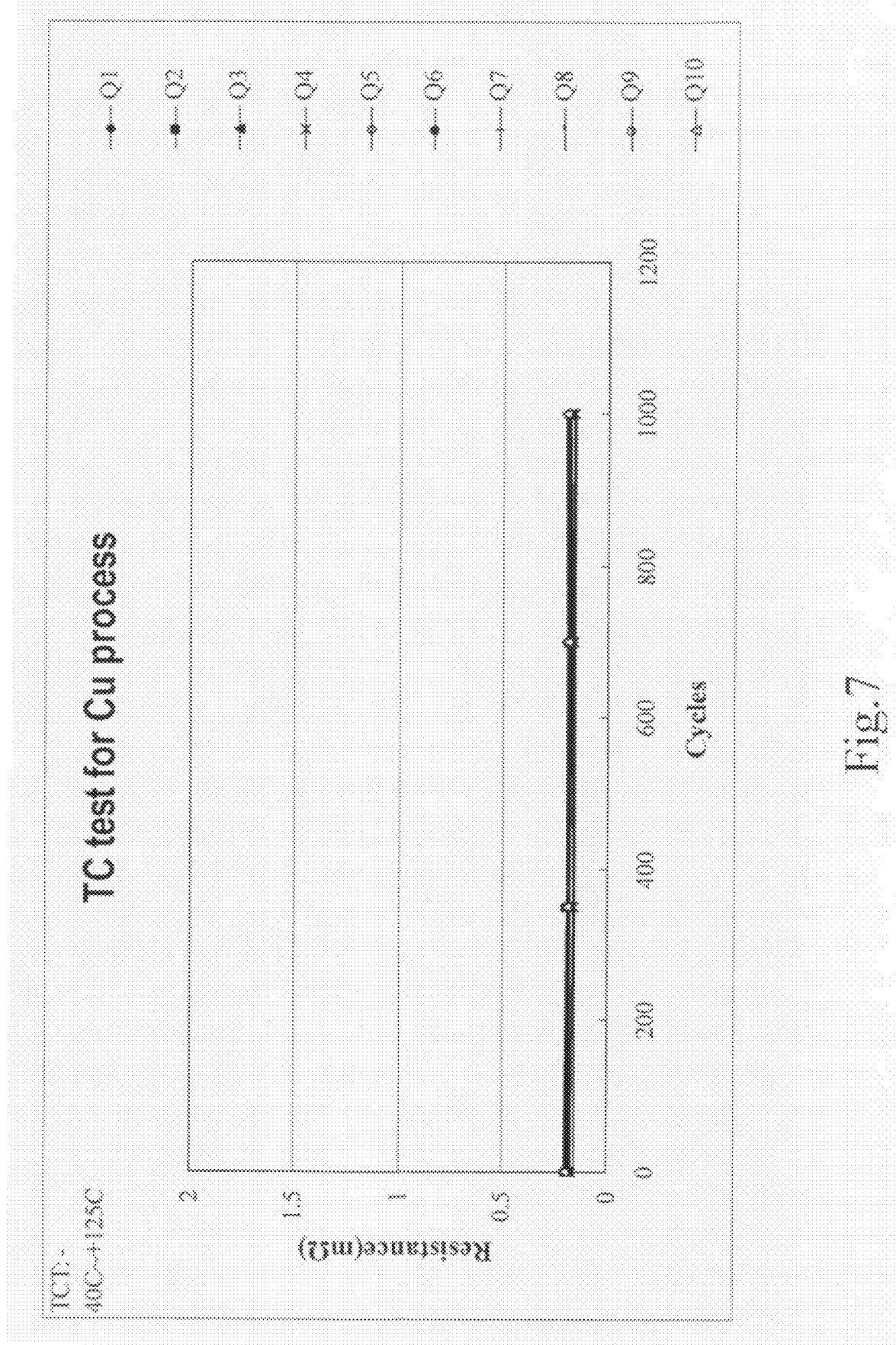
FIG. 7 is the thermal-cycle (TC) testing result of resistance for those transistors on fabricated wafers with backside metal layer (Cu) coated by the method of the present invention.

In addition, the performances of devices on wafer with backside metal layer fabricated by the method of the present invention have also been examined thoroughly. It was found that the use of electrolessly plated seed layer for backside metal layer can retain very good device performance and reliability. FIG. 5 and FIG. 6 are the examined results for devices on a wafer with an electrolessly plated palladium layer as a seed layer for backside metal. FIG. 5 is the measured beta values for transistors fabricated on wafers with backside metal layer formed by the method of the present invention after different times of thermal-cycling (TC) tests. One can see that the measured beta values are nearly unchanged even after 1000 times TC from −40° C. to 125° C., indicating an excellent device reliability. The same TC test has also been used to examine the resistance between the surface metal and the backside metal (Au ˋCu) layers. As shown in FIGS. 6 and 7, the measured values of resistance are also nearly unchanged after 1000 times TC from −40° C. to 125° C., indicating that the metal peeling can be prevented by the use of the electrolessly plated seed layer.

As discussed above, coating the backside metal seed layer using the electroless plating method of the present invention has the following advantages:
1. Cost reduction;
2. Volume production;
3. High uniformity in the thickness;
4. Good adhesion to substrate;
5. Improved the performance of front side devices.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A method of backside metal processes for a semiconductor wafer with electronic devices fabricated thereon comprising steps of:

fabricating backside via holes on a wafer backside using lithography techniques follows by etching process to etch through the wafer to a surface metal layer;

coating a thin metal layer or a thin metal alloy layer as a metal seed layer on a rear surface of the wafer and on an inner sidewalls of the backside via holes using an electroless plating method, wherein said electroless plating method for coating the thin metal layer or the thin metal alloy layer as the metal seed layer is performed by immersing the semiconductor wafer in a plating solution containing sources of metals, followed by reaction of an additive agent, which makes metallic ions in the plating solution metalized to a thin film on the backside of the semiconductor wafer, wherein said metal seed layer coated by the electroless plating method has a preferred thickness in a range of 20-500 nm; and depositing a backside metal layer directly on the metal seed layer after the coating of the metal seed layer to make good electrical contact between the surface metal layer and the backside metal layer via the backside via holes.

2. The method of backside metal processes described in claim 1 wherein the material of said metal seed layer can be Pd, Au, Ni, Ag, Co, Cr, Cu, Pt, or their alloys, such as NiP, NiB, AuSn, or Pt—Rh.

3. The method of backside metal processes described in claim 1 wherein said semiconductor wafer is a compound semiconductor wafer.

4. The method of backside metal processes described in claim 3, wherein compound semiconductor wafer is GaAs.

5. The method of backside metal processes described in claim 1 wherein the material of said backside metal layer is Au or Cu.

6. The method of backside metal processes described in claim 1 wherein said etching process can be the dry etching process using the reactive ion etching technique, or the wet etching process using suitable chemical solutions as etchants.

* * * * *